US011581875B1

(12) United States Patent
Mai et al.

(10) Patent No.: US 11,581,875 B1
(45) Date of Patent: Feb. 14, 2023

(54) INTEGRATED CIRCUIT HAVING A DIFFERENTIAL TRANSMITTER CIRCUIT

(71) Applicant: NXP B.V., Eindhoven (NL)

(72) Inventors: Khoi Mai, Austin, TX (US); Ashutosh Jain, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/452,276

(22) Filed: Oct. 26, 2021

(51) Int. Cl.
| | |
|---|---|
| *H03K 19/00* | (2006.01) |
| *H03K 3/011* | (2006.01) |
| *H04B 1/04* | (2006.01) |
| *H03K 19/0185* | (2006.01) |
| *H03K 17/687* | (2006.01) |
| *H03K 5/01* | (2006.01) |

(52) U.S. Cl.
CPC ............... *H03K 3/011* (2013.01); *H03K 5/01* (2013.01); *H03K 17/6872* (2013.01); *H03K 19/018507* (2013.01); *H03K 19/018528* (2013.01); *H04B 1/04* (2013.01)

(58) Field of Classification Search
None
See application file for complete search history.

(56) References Cited

U.S. PATENT DOCUMENTS

| | | | | |
|---|---|---|---|---|
| 7,034,574 B1* | 4/2006 | Li | ........................ | H04L 25/028 326/86 |
| 7,352,229 B1* | 4/2008 | Mei | ..................... | H04L 25/0272 327/306 |
| 7,400,170 B2 | 7/2008 | Bitting | | |
| 7,609,097 B2* | 10/2009 | Leonowich | ........ | H03K 19/0005 327/108 |
| 7,898,295 B1* | 3/2011 | Kasturirangan | ............................. | H03K 19/018528 326/86 |
| 11,075,636 B1* | 7/2021 | Abhishek | ......... | H03K 19/00384 |
| 2003/0139164 A1* | 7/2003 | Salcido | ............... | H04L 25/0278 455/280 |
| 2006/0208759 A1* | 9/2006 | Nojiri | .................... | H03K 3/012 326/81 |

(Continued)

OTHER PUBLICATIONS

Abugharbieh et al.: "An Ultralow-Power 10-Gbits/s LVDS Output Driver," IEEE Transactions on Circuits and Systems—I: Regular Papers, vol. 57, No. 1, Jan. 2010, pp. 262-269.

(Continued)

*Primary Examiner* — Tuan T Lam (57) ABSTRACT

In an integrated circuit, a first current source is coupled between a first supply voltage and a first node. An output stage includes a first current steering PMOS transistor coupled to the first node, a first current steering NMOS transistor including a first current electrode coupled to the first current steering PMOS transistor at a second node, a second current steering PMOS coupled to the first node, and a second current steering NMOS transistor including a first current electrode coupled to the second current steering PMOS transistor at a third node. Voltage at the second node is used to drive a gate of the second current steering PMOS transistor, and voltage at the third node is used to drive a gate of the first current steering PMOS transistor. First and second programmable slew rate pre-drivers provide outputs to the gates of the first and second current steering NMOS transistors, respectively.

22 Claims, 3 Drawing Sheets

(56) References Cited

U.S. PATENT DOCUMENTS

| | | | | |
|---|---|---|---|---|
| 2007/0057723 A1* | 3/2007 | Pan | ..................... | H03F 3/45179 |
| | | | | 330/252 |
| 2012/0071987 A1* | 3/2012 | Levy | ......................... | A61F 2/82 |
| | | | | 623/23.7 |
| 2012/0146718 A1* | 6/2012 | Pan | ..................... | H03F 3/45179 |
| | | | | 327/563 |

OTHER PUBLICATIONS

Chen et al.: "Low-Voltage Low-Power LVDS Drivers," IEEE Journal of Solid-State Circuits, vol. 40, No. 2, Feb. 2005, pp. 472-479.

Marar et al.: "A Power Efficient 3-Gbits/s 1,8V PMOS-Based LVDS Output Driver," IEEE, 2012 19th IEEE International Conference on Electronics, Circuits, and Systems (ICECS 2012), Dec. 9-12, 2012, Seville, Spain, pp. 240-243.

U.S. Appl. No. 17/343,164, Liang, Yongqin: "Low Voltage Differential Signaling Driver", filed Jun. 9, 2021.

\* cited by examiner

INTEGRATED CIRCUIT HAVING A DIFFERENTIAL TRANSMITTER CIRCUIT

BACKGROUND

Field

This disclosure relates generally to integrated circuits, and more specifically, to an integrated circuit having a differential transmitter circuit.

Related Art

Low Voltage Differential Signal (LVDS) is a technical standard that specifies electrical characteristics of a differential, serial communications protocol. LVDS typically operates at low voltage and can run at very high speeds, such as 5 Gbps. In an LVDS transmission system, differential signals are provided via a pair of transmission lines to a load in which the pair of lines carry complementary signals. LVDS transmitters typically need to have tight timing constraints to comply with the technical standard (e.g. TIA-EIA-644-A-2001) and achieve the high speed requirements, but these constraints are difficult to achieve over process, voltage, and temperature (PVT) variations.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Typically, a differential current-steering driver, such as an LVDS transmitter, uses four current-steering switches to properly steer current through the transmitter to provide the appropriate differential output signals. In order to meet the standard requirements for LVDS transmitters, such as output slew rate and common-mode transient peak-to-peak variation, the four current-steering switches of the LVDS transmitter (e.g. a pair of P-type metal-oxide-semiconductor field-effect (PMOS) transistors and a pair of N-type metal-oxide-semiconductor field-effect (NMOS) transistors) are typically controlled by four separate pre-driver signals which require tight timing constraints with respect to their turn-on thresholds and edge rates. However, achieving these constraints, especially over PVT variations, is difficult. Therefore, according to one aspect of the present invention, the number of required separate pre-driver signals is reduced and the timing constraints are simplified in order to achieve a more robust design, across PVT variations. In one embodiment, a pre-driver circuit with programmable slew rate provides a pair of pre-driver signals to control only one pair of the switches (e.g. the NMOS transistors), in which the other pair of switches (e.g. the PMOS transistors) are controlled by an internal loopback signal of the transmitter. Alternatively, the pair of control signals controls only the PMOS transistors while the NMOS transistors are controlled by an internal loopback signal.

Figure 1:
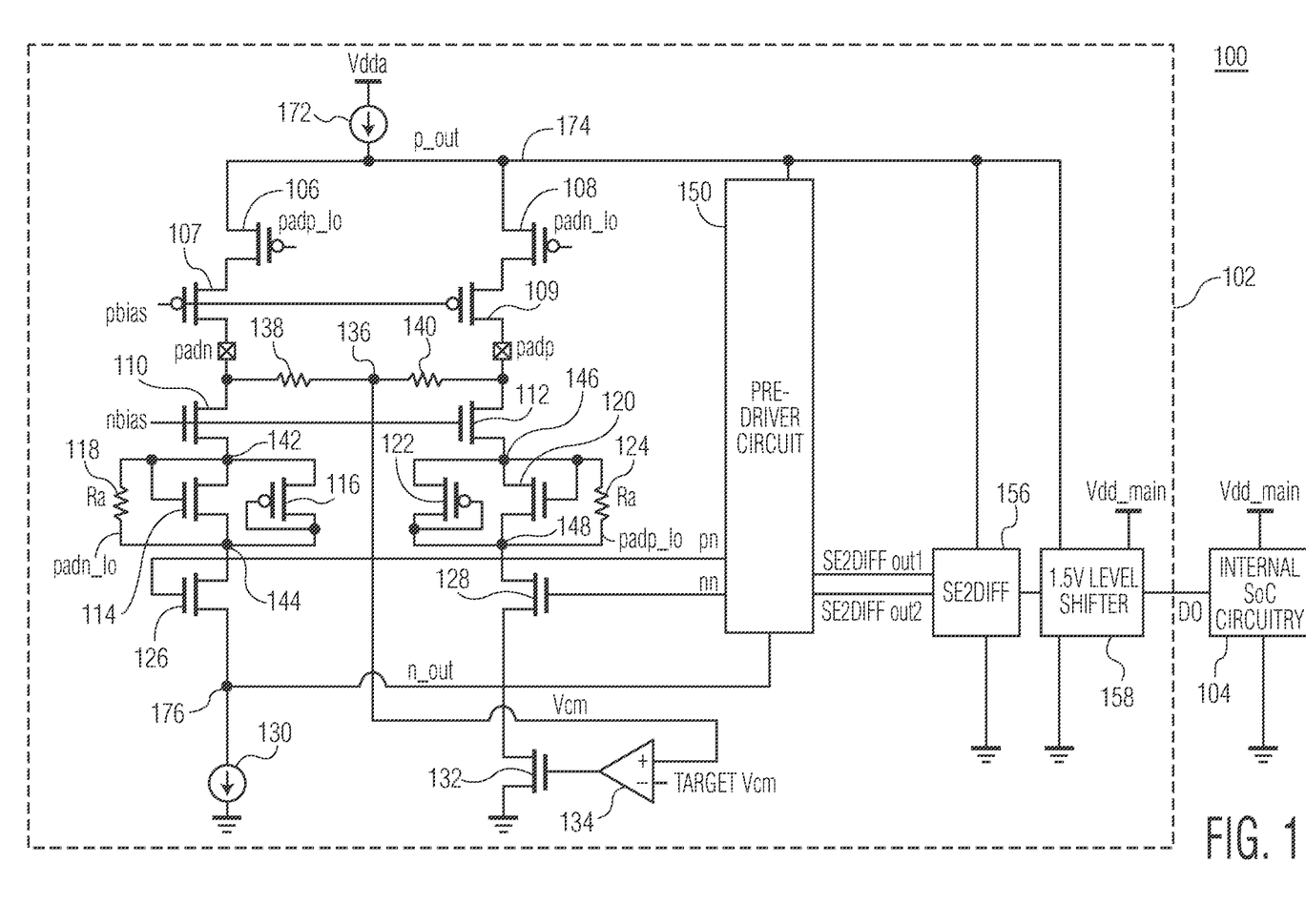
FIG. 1 illustrates, in partial block diagram and partial schematic form, an integrated circuit having a differential transmitter circuit in accordance with one embodiment of the present invention.

FIG. 1 illustrates an integrated circuit (IC) 100, which may be referred to as a System-on-Chip (SoC), having an LVDS transmitter circuit 102 and internal SoC circuitry 104. Internal SoC circuitry 104 is coupled to a first power supply terminal, Vdd_main, and a second power supply terminal, VSS, and includes any type of circuitry, such as any type of processing circuitry. Vdd_main provides a higher supply voltage than VSS, in which the first and second power supply terminals may simply be referred to as Vdd_main and VSS, respectively. Internal SoC circuitry 104 provides a digital single-ended data output signal, DO, to LVDS transmitter circuit 102, in which DO varies between Vdd_main and VSS Transmitter circuit 102 receives DO and generates output differential signals, padp and padn, at its output based on DO. The differential signals padp and padn can then be transmitted external to IC 100 via input/output (I/O) pins of IC 100. Transmitter circuit 102 is coupled to a third power supply terminal, Vdda, which provides a higher supply voltage than Vdd_main. The third power supply terminal may simply be referred to as Vdda. In one example, Vdd_main provides a 1.5 volt power supply voltage while Vdda provides a 1.8 volt power supply voltage, and VSS provides a ground voltage (e.g. zero volts). In another example, Vdd_main provides a 0.8 power supply voltage. Although FIG. 1 illustrates one output signal from internal SoC circuitry 104 and one transmitter circuit 102, internal SoC circuitry 104 can provide any number of digital single-ended data output signals, in which each can be provided to a corresponding transmitter circuit, similar to transmitter circuit 102. Alternatively, different digital single-ended data output signals can be time multiplexed as inputs to transmitter circuit 102.

Transmitter circuit 102 is an LVDS transmitter circuit, but in alternate embodiments, can be any type of differential current-steering driver circuit. Transmitter circuit 102 includes a level shifter 158, a single-ended to differential signal (SE2DIFF) converter 156, a pre-driver circuit 150, and an output stage including PMOS transistors 106 and 108 and NMOS transistors 126 and 128, in which these transistors may also be referred to as the current-steering transistors of transmitter circuit 102. (Note that level shifter 158, SE2DIFF converter 156, and pre-driver circuit 150 may be referred to collectively as the input stage of transmitter circuit 102.) Transmitter circuit 102 includes a first circuit node 174 which provides a voltage p_out and a second circuit node 176 which provides a voltage n_out, in which Vdda is greater than p_out, p_out is greater than n_out, and n_out is greater than VSS. Therefore, while SoC circuitry 104 is powered by Vdd_main, level shifter 158 has a portion powered by Vdd_main and a portion powered by p_out, SE2DIFF converter 156 is powered by p_out, and pre-diver circuit is powered by "p_out-n_out."

Level shifter 158 receives digital signal DO from internal SoC circuitry 104 and level shifts DO, such that level-shifted DO varies between p_out and VSS rather than Vdd_main and VSS. SE2DIFF converter 156 converts the single-ended level-shifted DO into a pair of differential signals, SE2DIFF out1 and SE2DIFF out2, which are provided to pre-driver circuit 150. Pre-driver circuit 150 has a first programmable slew rate pre-driver 152 which receives SE2DIFF out1 from SE2DIFF 156 and outputs a corresponding predrive signal, pn, and a second programmable slew rate pre-driver 154 which receives SE2DIFF out2 from SE2DIFF 156 and outputs a corresponding pre-drive signal, nn. Therefore, predrive signals pn and nn are differential signals generated based on DO. Note that pn and nn are complementary signals of each other, but their slew rates during transitions may differ.

The output stage of transmitter circuit 102 includes a first current source 172 having a first terminal coupled to Vdda and a second terminal coupled to node 174 which provides p_out. Transmitter circuit 102 also includes a second current source 130 having a first terminal coupled to node 176 which provides n_out, and a second terminal coupled to VSS. Transmitter circuit includes PMOS transistors 106, 107, 108, and 109, NMOS transistors 110, 126, 112, 128, and 132, diodes 114 and 120 (each implemented with an NMOS transistor, also referred to as a diode-connected NMOS transistor), resistors 138, 140, 118, and 124, diodes 116 and 122 (each implemented with a PMOS transistor, also referred to as a diode-connected PMOS transistor), and an amplifier 134 (also referred to as an analog comparator). First current electrodes of transistors 106 and 108 are coupled to node 174, a second current electrode of transistor 106 is coupled to a first current electrode of transistor 107, a second current electrode of transistor 107 is coupled to a first current electrode of transistor 110. The second current electrode of transistor 107 and the first current electrode of transistor 110 provide a transmitter output, padn. The second current electrode of transistor 108 is coupled to the first current electrode of transistor 109, and the second current electrode of transistor 109 is coupled to a first current electrode of transistor 112. The second current electrode of transistor 109 and the first current electrode of transistor 112 provide a transmitter output, padp, in which padp and padn provide a differential output pair of transmitter 102 based on digital input signal DO.

Continuing with transmitter circuit 102, a first current electrode of transistor 110 is coupled to a first terminal of resistor 138, a second terminal of resistor 138 is coupled to a circuit node 136 (which corresponds to the common mode voltage, Vcm, of transmitter circuit 102), a first terminal of resistor 140 is coupled to node 136, and a second terminal of resistor 140 is coupled to the first current electrode of transistor 112. A second current electrode of transistor 110 is coupled to a circuit node 142 and to a first current electrode of transistor 114, and a second current electrode of transistor 114 is coupled to a circuit node 144 which provides a first loopback signal, padn_lo, and is also coupled to a first current electrode of transistor 126. A second current electrode of transistor 126 is coupled to circuit node 176 and the first terminal of current source 130. A second current electrode of transistor 112 is coupled to a circuit node 146 and to a first current electrode of transistor 120, and a second current electrode of transistor 120 is coupled to a circuit node 148 which provides a second loopback signal, padp_lo, and is also coupled to a first current electrode of transistor 128. A second current electrode of transistor 128 is coupled to node 176 and to a first current electrode of transistor 132. A second current electrode of transistor 132 is coupled to VSS.

A control electrode of transistor 106 is coupled to node 148 to receive loopback signal padp_lo, and a control electrode of transistor 108 is coupled to node 144 to receive loopback signal padn_lo. The control electrodes of transistors 107 and 109 are coupled to receive a first bias voltage, pbias, and the control electrodes of transistors 110 and 112 are coupled to receive a second bias voltage, nbias. Transistors 107, 109, 110, and 112 operate as protection transistors to ensure that the voltage drop over any of the low voltage devices does not go beyond the safe operating voltage range of the device. For example, these transistors protect the low voltage devices such as transistors 106, 114, 126, 108, 122, 120, 128 and 132. Diode 116 includes a first current electrode coupled to node 142, a second current electrode coupled to node 144, and a control electrode also coupled to node 144. Diode 122 includes a first current electrode coupled to node 146, a second current electrode coupled to node 148, and a control electrode also coupled to node 148. Resistor 118 has a first terminal coupled to node 142, and a second terminal coupled to node 144. Resistor 124 has a first terminal coupled to node 146, and a second terminal coupled to node 148. Each of resistors 118 and 124 has the same resistance of Ra. Alternatively, they may have different resistances.

An output of amplifier 134 is coupled to a current electrode of transistor 132, a first input (non-inverting input) of amplifier 134 is coupled to node 136 to receive the sensed Vcm, and a second input (inverting input) of amplifier 134 is coupled to receive a target Vcm. Therefore, the output of amplifier 134 modulates the current through transistor 132 so that the sensed Vcm equals the target Vcm. A control electrode of transistor 126 receives pre-drive signal pn, and a control electrode of transistor 128 receives pre-drive signal nn, in which pn and nn provide the differential input signal to the output stage of transmitter circuit 102. Differential output pair padp and padn are provided based on inputs pn and nn. The signals at padn and padp can be provided externally via I/O pads of IC 100. In one example, the signals from padn and padp can be provided via a pair of transmission lines which may be twisted wires or traces on a printed circuit board.

In operation, pbias and nbias are set so as to turn on transistors 107, 109, 110, and 112 as cascode devices to protect against over voltages. SE2DIFF 156 and pre-driver circuit 150 converts the single ended input signal, DO, to complementary output signals, including complementary signals pn and nn. The output stage of transmitter circuit 102 receives pn and nn and outputs complementary pad signals padn and padp, around common mode voltage, Vcm. For example, if pn is a logic level high (and thus nn is a logic level low), then transistor 126 is on and transistor 128 is off. With transistor 126 on, padn_lo at node 144 is pulled towards VSS, turning on transistor 108 as well. With transistor 128 off, padp_lo is pulled to p_out via resistor 124, turning off transistor 106. This results in current flowing from transistor 108 to transistor 126 through resistors 138 and 140, such that padp is driven high and padn is driven low. Conversely, if pn is a logic level low (and thus nn is a logic level high), then transistor 126 is off and transistor 128 is on. With transistor 128 on, padp_lo is pulled low, turning on transistor 106, and with transistor 126 off, padn_lo is pulled to p_out via resistor 118, turning off transistor 108. This results in current flowing from transistor 106 to transistors 128 and 132 through resistors 138 and 140, driving padn high and padp low. Therefore, each of transistors 106, 108, 126, and 128 may be referred to as current steering transistors or as switches or current steering switches, which control current flow from padp to padn or from padn to padp (depending on the values of pn and nn). Note also that transistors 106 and 108 may be referred to as pull-up devices, and transistors 126 and 128 may be referred to as pull-down devices.

Figure 2:
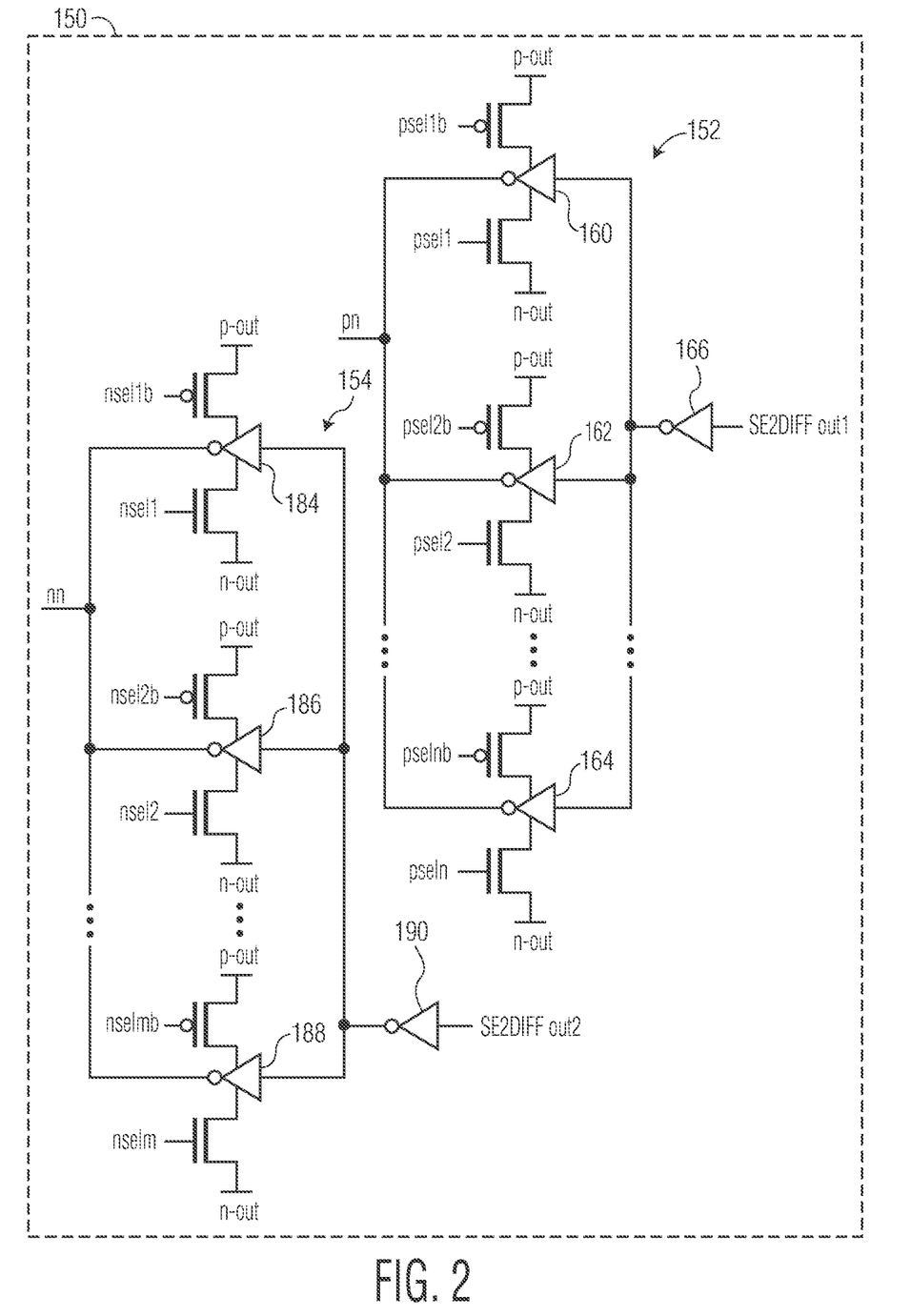
FIG. 2 illustrates a pre-driver circuit of FIG. 1 in accordance with one embodiment of the present invention.

FIG. 2 illustrates, in schematic form, pre-driver circuit 150 of FIG. 1, including programmable slew rate pre-drivers 152 and 154, in accordance with one embodiment of the present invention. Programmable slew rate pre-driver 152 includes an inverter 166 which receives SE2DIFF out1 from SE2DIFF converter 156 at its input and provides pn at its output. Programmable slew rate pre-driver 152 also includes one or more programmable (i.e. selectable) tristate inverters, such as tristate inverters 160, 162, and 168, coupled in parallel with each other between the output which provides pn and the output of inverter 166. Each programmable tristate inverter has a first power terminal coupled via a switch (implemented as a PMOS transistor) to p_out and a second power terminal coupled via a switch (implemented as an NMOS transistor) to n_out. Each tristate inverter can be selectively enabled by controlling the switches to either power the tristate inverter (by connecting the tristate inverter to p_out and n_out) or not power the tristate inverter (by disconnecting the tristate inverter from p_out and n_out). For example, programmable slew rate pre-driver 152 may include N tristate inverters in which each receives a corresponding pair of select signals psel1/psel1b-pseln/pselnb (in which a "b" following a signal name indicates the inverse or complement of the signal). When a corresponding select signal is asserted (e.g. psel1=1 and pselb=0 for tristate inverter 160), that inverter is enabled or selected. When a corresponding select signal is negated (e.g. psel1=0 and pselb=1 for tristate buffer 160), that inverter is disabled or not selected. Note that the output of a disabled or not selected tristate inverter is at a high impedance state. N can be any number greater than or equal to one (in order to have at least one inverter in series with inverter 166).

Note that the same description applies to programmable slew rate pre-driver 154 which includes an inverter 190 which receives SE2DIFF out1 from SE2DIFF converter 156 at its input and provides nn at its output, and includes one or more programmable (i.e. selectable) tristate inverters, such as tristate inverters 184, 186, and 188, coupled in parallel with each other between the output which provides nn and the output of inverter 190. For example, programmable slew rate pre-driver 154 may include M tristate inverters in which each receives a corresponding pair of select signals nsel1/nsel1b-nselm/nselmb. Each tristate inverter is selectively enabled as described above for programmable slew rate pre-driver 152, such as by asserting or negating the corresponding select signal of sel1-selm to select or not select the inverter, respectively. M can be any number greater than or equal to one (in order to have at least one inverter in series with inverter 190), and may be the same as or different than N for programmable slew rate pre-driver 152. In operation, by controlling how many tristate inverters are selected for each of programmable slew rate pre-driver 152 and programmable slew rate pre-driver 154, the slew rates of pn and nn, respectively, can be programmed as desired.

Figure 3:
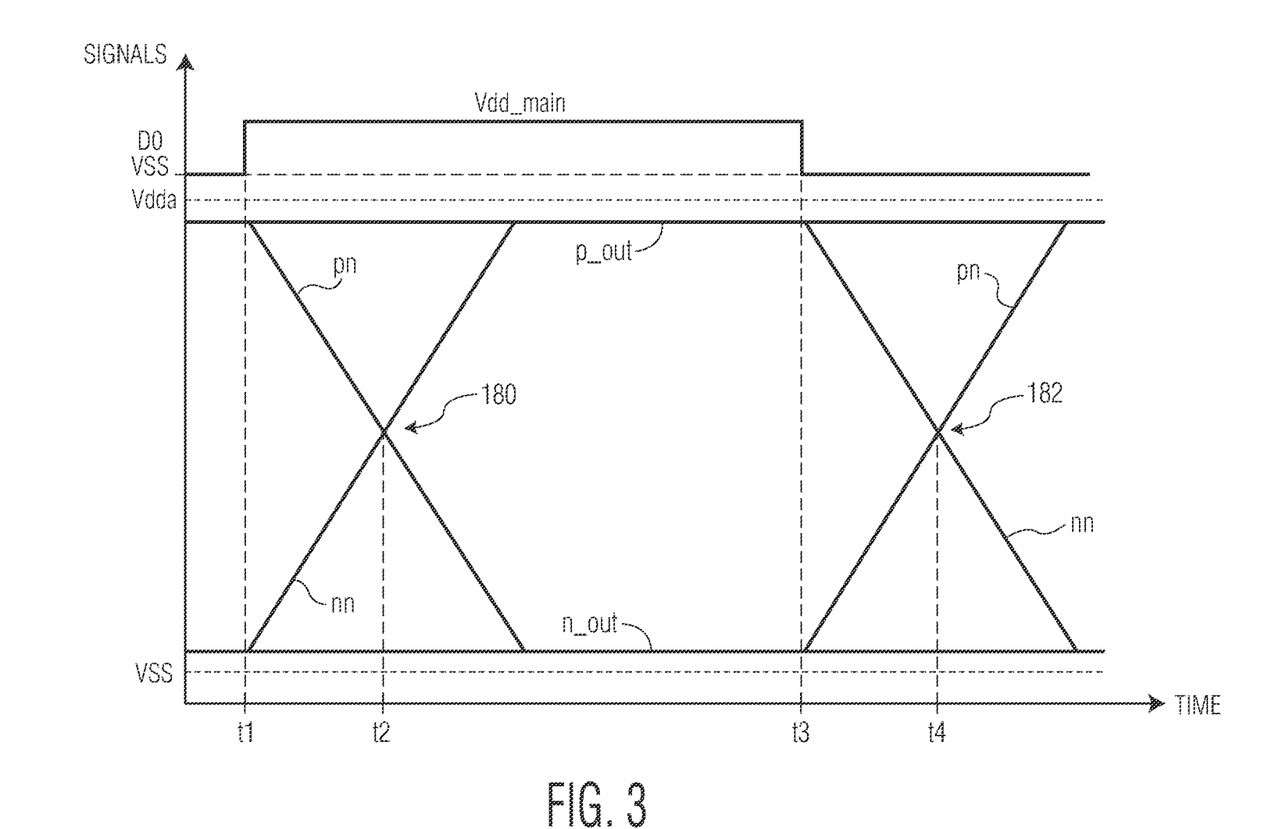
FIG. 3 illustrates a timing diagrams of various signals in the circuit of FIG. 1, in accordance with one embodiment of the present invention.

FIG. 3 illustrates a timing diagram with signals DO, pn, and nn of transmitter circuit 102 of FIGS. 1 and 2, in accordance with one example of the present invention. Due to pre-driver circuit 150 being powered between p_out and n_out (provided by circuit nodes 174 and 176, respectively, in which p_out is less than Vdda and n_out is greater than VSS), each of pn and nn output by the buffers varies between p_out and n_out. As illustrated in FIG. 3, in response to the digital input DO transitioning between VSS and Vdd_main, programmable slew rate pre-driver 152 drives pn to p_out or n_out, based on the first differential output of SE2DIFF converter 156, and programmable slew rate pre-driver 154 drives nn to p_out or n_out, based on the second differential output of SE2DIFF converter 156.

In FIG. 3, at time t1, DO transitions from VSS (0V) to Vdd_main. In response, pn is driven low from p_out to n_out, and nn is driven high from n_out to p_out. The slope of pn between p_out and n_out is determined by the drive strength of programmable slew rate pre-driver 152 (e.g. depending on how many parallel tristate inverters are enabled in series with inverter 166). Similarly, the slope of nn between n_out and p_out is determined by the drive strength of programmable slew rate pre-driver 154 (e.g. depending on how many parallel tristate inverters are enabled in series with inverter 190). At time t2, the signals pn and nn cross at point 180. At time t3, DO transitions from Vdd_main back to VSS. In response, pn is driven high from n_out to p_out, and nn is driven low from p_out to n_out. The slopes of pn and nn are again determined by the drive strength of programmable slew rate pre-drivers 152 and 154, respectively. At time t4, pn and nn cross at point 182.

As can be seen with transmitter circuit 102, the pair of NMOS current-steering transistors (e.g. transistors 126 and 128) are controlled by pn and nn, respectively, from pre-driver circuit 150. However, the pair of PMOS current-steering transistors (e.g. transistors 106 and 108) are not driven by separate pre-drive signals provided by a pre-driver circuit, such as pre-driver circuit 150. Instead, they are provided from circuit nodes internal to the output stage of transmitter 102, e.g. by loopback signals padp_lo and padn_lo, respectively, generated at circuit nodes 148 and 144, respectively. In this manner, the control signals for the PMOS current-steering transistors are similarly affected by PVT variations as control signals pn and nn for the NMOS current-steering transistors. In this manner, note that the cross-points (e.g. points 180 and 182 of FIG. 2) need not be precisely designed to occur exactly a threshold voltage from p_out or n_out. Also, with pre-driver circuit 150 being coupled between p_out and n_out, diodes 114, 116, 120 and 122 and resistors 118 and 124 are used to provide sufficient voltage head room. The diodes provide a gate-to-source voltage (Vgs) drop when there is current flow, and the resistors minimize the Vgs drop when there is no current flow.

In an alternate embodiment, polarities may be reversed, such that the pair of PMOS current steering transistors instead are controlled by signals provided by pre-driver circuit 150, and the pair of NMOS current steering transistors are instead controlled by circuit nodes internal to the output stage. For example, circuitry similar to resistors 118/124, transistors 114/122, and diodes 116/122 can be placed between transistors 106 and 107 and between transistors 108 and 109, respectively, rather than between transistors 110 and 126 and between transistors 112 and 128, respectively. In this example, the polarity of transistors 114/122 and diodes 116/122 may be changed, as needed, as well as the polarity of the pre-drive signals from pre-driver circuit 150. Furthermore, these concepts may be applied to the current-steering switches of any differential current steering driver to meet slew rate or maximum voltage limitations, and is not limited to LVDS transmitters.

Therefore, by now it can be understood how an improved differential current-steering driver allows for less restrictive timing control, thus improving the device's design cycle. For example, the transmitter circuit described herein using programmable slew rates and providing pre-drive signals to only a portion of the current steering switches is less susceptible to PVT variation as compared to typical transmitter circuits which require separate pre-drive signals for each current steering switch. Further, simplifying the timing constraints of the transmitter circuit, a more robust and faster design cycle may be achieved.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of transmitter 100 are located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different circuit configurations with different circuit elements may be used to implement programmable slew rate pre-drivers 152 and 154 to program the slew rates of pn and nn as needed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In an embodiment, an integrated circuit (IC) device includes a first current source coupled between a first supply voltage and a first node; a second current source coupled to a second supply voltage that is lower than the first supply voltage; and an output stage. The output stage includes a first current steering PMOS transistor including a first current electrode coupled to the first node, a second current electrode, and a gate electrode; a first current steering NMOS transistor including a first current electrode coupled to the second current electrode of the first current steering PMOS transistor at a second node, a second current electrode coupled to the second current source, and a gate electrode; a second current steering PMOS transistor including a first current electrode coupled to the first node, a second current electrode, and a gate electrode; and a second current steering NMOS transistor including a first current electrode coupled to the second current electrode of the second current steering PMOS transistor at a third node, a second current electrode selectively couplable to the second supply voltage through a third NMOS transistor, and a gate electrode. Voltage at the second node is used to drive the gate electrode of the second current steering PMOS transistor, and voltage at the third node is used to drive the gate electrode of the first current steering PMOS transistor. In one aspect, the IC device further includes an input stage including a level shifter circuit; a single-ended to differential (SE2DIFF) converter including an input coupled to an output of the level shifter circuit; and a pre-driver circuit coupled to the level shifter circuit and coupled between the first and second current sources. The pre-driver circuit includes a first programmable slew rate pre-driver including an output coupled to the control gate of the first current steering NMOS transistor, a first inverter including an input coupled to receive a first differential signal from the SE2DIFF converter, and a second inverter including an input coupled to an output of the first inverter of the first programmable slew rate pre-driver; and a second programmable slew rate pre-driver including an output coupled to the control gate of the second current steering NMOS transistor, a first inverter including an input coupled to receive a second differential signal from the SE2DIFF converter, and a second inverter including an input coupled to an output of the first inverter of the second programmable slew rate pre-driver. In a further aspect, the second inverters are configured to be selectively enabled; the first programmable slew rate pre-driver further includes additional selectable inverters, wherein each of the additional selectable inverters of the first programmable slew rate pre-driver are configured to be selectively enabled and are coupled in parallel with the second inverter of the first programmable slew rate pre-driver; and the second programmable slew rate pre-driver further includes additional selectable inverters, wherein each of the additional selectable inverters of the second programmable slew rate pre-driver are configured to be selectively enabled and are coupled in parallel with the second inverter of the second programmable slew rate pre-driver. In another further aspect, the IC device further includes internal integrated circuitry configured to be powered by a main voltage supply; and the level shifter includes an input coupled to the internal integrated circuitry and an output coupled to an input of the SE2DIFF converter. In another aspect of the above embodiment, the IC device further includes a first output voltage at the first node; and a second output voltage at a seventh node, wherein the second current source is coupled between the seventh node and the second supply voltage. In a further aspect, the first supply voltage is greater than the first output voltage, the first output voltage is greater than the second output voltage, and the second output voltage is greater than the second supply voltage. In another aspect, the IC device further includes a first protection PMOS transistor including a first current electrode coupled to the second current electrode of the first current steering PMOS transistor, a second current electrode coupled to a fourth node, and a gate electrode coupled to a first bias voltage; a first protection NMOS transistor including a first current electrode coupled to the fourth node, a second current electrode coupled to a fifth node, and a gate electrode coupled to a second bias voltage; a second protection PMOS transistor including a first current electrode coupled to the second current electrode of the second current steering PMOS transistor, a second current electrode coupled to a sixth node, and a gate electrode coupled to the gate electrode of first protection PMOS transistor; and a second protection NMOS transistor including a first current electrode coupled to the sixth node, a second current electrode coupled to an eighth node, and a gate electrode coupled to the gate electrode of the first protection NMOS transistor. In a further aspect, the IC device further includes a first resistive element including a first terminal coupled to the fourth node and a second terminal coupled to a ninth node; a second resistive element including a first terminal coupled to the ninth node and a second terminal coupled to the sixth node; and an amplifier including a first input coupled to the ninth node, a second input coupled to a target common mode voltage, and an output coupled to a gate electrode of the third NMOS transistor. In another aspect, the IC device further includes a first diode-connected NMOS transistor coupled between the second and fifth nodes; a first diode-connected PMOS transistor coupled in parallel with the first diode-connected NMOS transistor; and a third resistive element coupled in parallel with the first diode-connected NMOS transistor and the first diode-connected PMOS transistor. In a further aspect, the IC device further includes a second diode-connected NMOS transistor coupled between the third and eighth nodes; a second diode-connected PMOS transistor coupled in parallel with the second diode-connected NMOS transistor; and a fourth resistive element coupled in parallel with the second diode-connected NMOS transistor and the second diode-connected PMOS transistor.

In another embodiment, an integrated circuit (IC) device includes an input stage including a pre-driver circuit including a first programmable slew rate pre-driver and a second programmable slew rate pre-driver; and an output stage including a first current steering PMOS transistor including a first current electrode coupled to a first circuit node, a second current electrode coupled to a second circuit node, and a gate electrode; a first current steering NMOS transistor including a first current electrode coupled to the second circuit node, a second electrode coupled to a third circuit node, and a gate electrode coupled to an output of the first programmable slew rate pre-driver; a second current steering PMOS transistor including a first current electrode coupled to the first circuit node, a second current electrode coupled to a fourth circuit node, and a gate electrode; and a second current steering NMOS transistor including a first current electrode coupled to the fourth circuit node, a second electrode coupled to the third circuit node, and a gate electrode coupled to an output of the second programmable slew rate pre-driver. Voltage at the second circuit node is provided to the gate electrode of the second current steering PMOS transistor, and voltage at the fourth circuit node is provided to the gate electrode of the first current steering PMOS transistor. In one aspect, the input stage further includes a level shifter circuit; and a single-ended to differential (SE2DIFF) converter including an input coupled to an output of the level shifter circuit, wherein first and second inputs of the pre-driver circuit coupled to respective first and second outputs of the SE2DIFF converter, wherein the first programmable slew rate pre-driver includes an input coupled to receive a first differential signal from the SE2DIFF converter; and wherein the second programmable slew rate pre-driver includes an input coupled to receive a second differential signal from the SE2DIFF converter. In a further aspect, the IC device further includes internal integrated circuitry configured to be powered by a main voltage supply; and the level shifter including an input coupled to the internal integrated circuitry. In another aspect, the first programmable slew rate pre-driver includes an inverter having an input coupled to receive the first differential signal from the SE2DIFF converter; a first selectable inverter having an input coupled to an output of the inverter of the first programmable slew rate pre-driver and having an output coupled to the gate electrode of the first current steering NMOS transistor; and one or more additional selectable inverters coupled in parallel with the first selectable inverter of the first programmable slew rate pre-driver, wherein each of the first and additional selectable inverters of the first programmable slew rate pre-driver are configured to be selectively enabled. In a further aspect, the second programmable slew rate pre-driver includes an inverter having an input coupled to receive the second differential signal from the SE2DIFF converter; a first selectable inverter having an input coupled to an output of the inverter of the second programmable slew rate pre-driver and having an output coupled to the gate electrode of the second current steering NMOS transistor; and one or more additional selectable inverters coupled in parallel with the first selectable inverter of the second programmable slew rate pre-driver, wherein each of the first and additional selectable inverters of the first programmable slew rate pre-driver are configured to be selectively enabled. In yet a further aspect, each of the selectable inverters is implemented with a tristate inverter. In another aspect of the another embodiment, the IC device further includes a first supply voltage; a first current source coupled between the first supply voltage and the first node; a second supply voltage; a second current source coupled between the second supply voltage and the third node; a first output voltage at the first node; and a second output voltage at the third node. In a further aspect, the first supply voltage is greater than or equal to the first output voltage, the first output voltage is greater than the second output voltage, and the second output voltage is greater than or equal to the second supply voltage. In another aspect of the another embodiment, the IC device further includes a first protection PMOS transistor including a first current electrode coupled to the second current electrode of the first current steering PMOS transistor, a second current electrode coupled to a fifth node, and a gate electrode coupled to a first bias voltage; a first protection NMOS transistor including a first current electrode coupled to the fifth node, a second current electrode coupled to a seventh node, and a gate electrode coupled to a second bias voltage; a second protection PMOS transistor including a first current electrode coupled to the second current electrode of the second current steering PMOS transistor, a second current electrode coupled to a sixth node, and a gate electrode coupled to the gate electrode of first protection PMOS transistor; and a second protection NMOS transistor including a first current electrode coupled to the sixth node, a second current electrode coupled to an eighth node, and a gate electrode coupled to the gate electrode of the first protection NMOS transistor. In yet a further aspect, the IC device further includes a third NMOS transistor including a first current electrode coupled to the second current electrode of the second current steering transistor, a second current electrode coupled to the second supply voltage, and a gate electrode; a first resistive element including a first terminal coupled to the fifth node and a second terminal coupled to a ninth node; a second resistive element including a first terminal coupled to the ninth node and a second terminal coupled to the sixth node; an amplifier including a first input coupled to the ninth node, a second input coupled to a target common mode voltage, and an output coupled to the gate electrode of the third NMOS transistor. In another further aspect, the IC device further includes a first diode-connected NMOS transistor coupled between the second and fifth nodes; a first diode-connected PMOS transistor coupled in parallel with the first diode-connected NMOS transistor; a third resistive element coupled in parallel with the first diode-connected NMOS transistor and the first diode-connected PMOS transistor; a second diode-connected NMOS transistor coupled between the fourth and eighth nodes; a second diode-connected PMOS transistor coupled in parallel with the second diode-connected NMOS transistor; and a fourth resistive element coupled in parallel with the second diode-connected NMOS transistor and the second diode-connected PMOS transistor.

The invention claimed is:

1. An integrated circuit device comprising:
   a first current source coupled between a first supply voltage and a first node;
   a second current source coupled to a second supply voltage that is lower than the first supply voltage;
   an output stage including:
      a first current steering PMOS transistor including a first current electrode coupled to the first node, a second current electrode, and a gate electrode;
      a first current steering NMOS transistor including a first current electrode coupled to the second current electrode of the first current steering PMOS transistor at a second node, a second current electrode coupled to the second current source, and a gate electrode;
      a second current steering PMOS transistor including a first current electrode coupled to the first node, a second current electrode, and a gate electrode;
      a second current steering NMOS transistor including a first current electrode coupled to the second current electrode of the second current steering PMOS transistor at a third node, a second current electrode selectively couplable to the second supply voltage through a third NMOS transistor, and a gate electrode,
   wherein voltage at the second node is used to drive the gate electrode of the second current steering PMOS transistor, and voltage at the third node is used to drive the gate electrode of the first current steering PMOS transistor.

2. The integrated circuit device of claim 1 further comprising:
   an input stage including:
      a level shifter circuit;
      a single-ended to differential (SE2DIFF) converter including an input coupled to an output of the level shifter circuit;
      a pre-driver circuit coupled to the level shifter circuit and coupled between the first and second current sources, the pre-driver circuit including:
         a first programmable slew rate pre-driver including an output coupled to the control gate of the first current steering NMOS transistor, a first inverter including an input coupled to receive a first differential signal from the SE2DIFF converter, and a second inverter including an input coupled to an output of the first inverter of the first programmable slew rate pre-driver; and
         a second programmable slew rate pre-driver including an output coupled to the control gate of the second current steering NMOS transistor, a first inverter including an input coupled to receive a second differential signal from the SE2DIFF converter, and a second inverter including an input coupled to an output of the first inverter of the second programmable slew rate pre-driver.

3. The integrated circuit device of claim 2 wherein:
   the second inverters are configured to be selectively enabled;
   the first programmable slew rate pre-driver further includes additional selectable inverters, wherein each of the additional selectable inverters of the first programmable slew rate pre-driver are configured to be selectively enabled and are coupled in parallel with the second inverter of the first programmable slew rate pre-driver; and
   the second programmable slew rate pre-driver further includes additional selectable inverters, wherein each of the additional selectable inverters of the second programmable slew rate pre-driver are configured to be selectively enabled and are coupled in parallel with the second inverter of the second programmable slew rate pre-driver.

4. The integrated circuit device of claim 2 further comprising:
   internal integrated circuitry configured to be powered by a main voltage supply; and
   the level shifter including an input coupled to the internal integrated circuitry and an output coupled to an input of the SE2DIFF converter.

5. The integrated circuit device of claim 1 further comprising:
   a first output voltage at the first node; and
   a second output voltage at a seventh node, wherein the second current source is coupled between the seventh node and the second supply voltage.

6. The integrated circuit device of claim 5 wherein:
   the first supply voltage is greater than the first output voltage, the first output voltage is greater than the second output voltage, and the second output voltage is greater than the second supply voltage.

7. The integrated circuit device of claim 1 further comprising:
   a first protection PMOS transistor including a first current electrode coupled to the second current electrode of the first current steering PMOS transistor, a second current electrode coupled to a fourth node, and a gate electrode coupled to a first bias voltage;
   a first protection NMOS transistor including a first current electrode coupled to the fourth node, a second current electrode coupled to a fifth node, and a gate electrode coupled to a second bias voltage;
   a second protection PMOS transistor including a first current electrode coupled to the second current electrode of the second current steering PMOS transistor, a second current electrode coupled to a sixth node, and a gate electrode coupled to the gate electrode of first protection PMOS transistor; and
   a second protection NMOS transistor including a first current electrode coupled to the sixth node, a second current electrode coupled to an eighth node, and a gate electrode coupled to the gate electrode of the first protection NMOS transistor.

8. The integrated circuit device of claim 7 further comprising:
   a first resistive element including a first terminal coupled to the fourth node and a second terminal coupled to a ninth node;
   a second resistive element including a first terminal coupled to the ninth node and a second terminal coupled to the sixth node;
   an amplifier including a first input coupled to the ninth node, a second input coupled to a target common mode voltage, and an output coupled to a gate electrode of the third NMOS transistor.

9. The integrated circuit device of claim 7 further comprising:
   a first diode-connected NMOS transistor coupled between the second and fifth nodes;
   a first diode-connected PMOS transistor coupled in parallel with the first diode-connected NMOS transistor; and
   a third resistive element coupled in parallel with the first diode-connected NMOS transistor and the first diode-connected PMOS transistor.

10. The integrated circuit device of claim 9 further comprising:
    a second diode-connected NMOS transistor coupled between the third and eighth nodes;
    a second diode-connected PMOS transistor coupled in parallel with the second diode-connected NMOS transistor; and
    a fourth resistive element coupled in parallel with the second diode-connected NMOS transistor and the second diode-connected PMOS transistor.

11. An integrated circuit device comprising:
    an input stage including:
       a pre-driver circuit including a first programmable slew rate pre-driver and a second programmable slew rate pre-driver;
       a level shifter circuit; and
       a single-ended to differential (SE2DIFF) converter including an input coupled to an output of the level shifter circuit,
       wherein first and second inputs of the pre-driver circuit are coupled to respective first and second outputs of the SE2DIFF converter,
       wherein the first programmable slew rate pre-driver includes an input coupled to receive a first differential signal from the SE2DIFF converter, and
       wherein the second programmable slew rate pre-driver includes an input coupled to receive a second differential signal from the SE2DIFF converter;
    an output stage including:
       a first current steering PMOS transistor including a first current electrode coupled to a first circuit node, a second current electrode coupled to a second circuit node, and a gate electrode;
       a first current steering NMOS transistor including a first current electrode coupled to the second circuit node, a second electrode coupled to a third circuit node, and a gate electrode coupled to an output of the first programmable slew rate pre-driver;
       a second current steering PMOS transistor including a first current electrode coupled to the first circuit node, a second current electrode coupled to a fourth circuit node, and a gate electrode; and
       a second current steering NMOS transistor including a first current electrode coupled to the fourth circuit node, a second electrode, and a gate electrode coupled to an output of the second programmable slew rate pre-driver,
       wherein voltage at the second circuit node is provided to the gate electrode of the second current steering PMOS transistor, and voltage at the fourth circuit node is provided to the gate electrode of the first current steering PMOS transistor.

12. The integrated circuit device of claim 11 further comprising:
    internal integrated circuitry configured to be powered by a main voltage supply; and
    the level shifter including an input coupled to the internal integrated circuitry.

13. The integrated circuit device of claim 11, wherein:
    the first programmable slew rate pre-driver comprises:
       an inverter having an input coupled to receive the first differential signal from the SE2DIFF converter;
       a first selectable inverter having an input coupled to an output of the inverter of the first programmable slew rate pre-driver and having an output coupled to the gate electrode of the first current steering NMOS transistor; and
       one or more additional selectable inverters coupled in parallel with the first selectable inverter of the first programmable slew rate pre-driver, wherein each of the first and additional selectable inverters of the first programmable slew rate pre-driver are configured to be selectively enabled; and
    the second programmable slew rate pre-driver comprises:
       an inverter having an input coupled to receive the second differential signal from the SE2DIFF converter;

a first selectable inverter having an input coupled to an output of the inverter of the second programmable slew rate pre-driver and having an output coupled to the gate electrode of the second current steering NMOS transistor; and one or more additional selectable inverters coupled in parallel with the first selectable inverter of the second programmable slew rate pre-driver, wherein each of the first and additional selectable inverters of the first programmable slew rate pre-driver are configured to be selectively enabled.

14. The integrated circuit device of claim 13 wherein each of the selectable inverters is implemented with a tristate inverter.

15. An integrated circuit device comprising:
an input stage including:
a pre-driver circuit including a first programmable slew rate pre-driver and a second programmable slew rate pre-driver;
an output stage including:
a first current steering PMOS transistor including a first current electrode coupled to a first circuit node, a second current electrode coupled to a second circuit node, and a gate electrode;
a first current steering NMOS transistor including a first current electrode coupled to the second circuit node, a second electrode coupled to a third circuit node, and a gate electrode coupled to an output of the first programmable slew rate pre-driver;
a second current steering PMOS transistor including a first current electrode coupled to the first circuit node, a second current electrode coupled to a fourth circuit node, and a gate electrode; and
a second current steering NMOS transistor including a first current electrode coupled to the fourth circuit node, a second electrode, and a gate electrode coupled to an output of the second programmable slew rate pre-driver, wherein voltage at the second circuit node is provided to the gate electrode of the second current steering PMOS transistor, and voltage at the fourth circuit node is provided to the gate electrode of the first current steering PMOS transistor;
a first supply voltage;
a first current source coupled between the first supply voltage and the first node;
a second supply voltage;
a second current source coupled between the second supply voltage and the third node;
a first output voltage at the first node; and
a second output voltage at the third node.

16. The integrated circuit device of claim 15 wherein:
the first supply voltage is greater than or equal to the first output voltage, the first output voltage is greater than the second output voltage, and the second output voltage is greater than or equal to the second supply voltage.

17. The integrated circuit device of claim 15 further comprising:
a first protection PMOS transistor including a first current electrode coupled to the second current electrode of the first current steering PMOS transistor, a second current electrode coupled to a fifth node, and a gate electrode coupled to a first bias voltage;

a first protection NMOS transistor including a first current electrode coupled to the fifth node, a second current electrode coupled to a seventh node, and a gate electrode coupled to a second bias voltage;

a second protection PMOS transistor including a first current electrode coupled to the second current electrode of the second current steering PMOS transistor, a second current electrode coupled to a sixth node, and a gate electrode coupled to the gate electrode of first protection PMOS transistor; and a second protection NMOS transistor including a first current electrode coupled to the sixth node, a second current electrode coupled to an eighth node, and a gate electrode coupled to the gate electrode of the first protection NMOS transistor.

18. The integrated circuit device of claim 17 further comprising:
a third NMOS transistor including a first current electrode coupled to the second current electrode of the second current steering NMOS transistor, a second current electrode coupled to the second supply voltage, and a gate electrode;
a first resistive element including a first terminal coupled to the fifth node and a second terminal coupled to a ninth node;
a second resistive element including a first terminal coupled to the ninth node and a second terminal coupled to the sixth node;
an amplifier including a first input coupled to the ninth node, a second input coupled to a target common mode voltage, and an output coupled to the gate electrode of the third NMOS transistor.

19. The integrated circuit device of claim 17 further comprising:
a first diode-connected NMOS transistor coupled between the second and fifth seventh nodes;
a first diode-connected PMOS transistor coupled in parallel with the first diode-connected NMOS transistor;
a third resistive element coupled in parallel with the first diode-connected NMOS transistor and the first diode-connected PMOS transistor;
a second diode-connected NMOS transistor coupled between the fourth and eighth nodes;
a second diode-connected PMOS transistor coupled in parallel with the second diode-connected NMOS transistor; and
a fourth resistive element coupled in parallel with the second diode-connected NMOS transistor and the second diode-connected PMOS transistor.

20. An integrated circuit device comprising:
an input stage including:
a pre-driver circuit including a first programmable slew rate pre-driver and a second programmable slew rate pre-driver;
an output stage including:
a first current steering PMOS transistor including a first current electrode coupled to a first circuit node, a second current electrode coupled to a second circuit node, and a gate electrode;
a first current steering NMOS transistor including a first current electrode coupled to the second circuit node, a second electrode coupled to a third circuit node, and a gate electrode coupled to an output of the first programmable slew rate pre-driver;

a second current steering PMOS transistor including a first current electrode coupled to the first circuit node, a second current electrode coupled to a fourth circuit node, and a gate electrode; and a second current steering NMOS transistor including a first current electrode coupled to the fourth circuit node, a second electrode, and a gate electrode coupled to an output of the second programmable slew rate pre-driver, wherein voltage at the second circuit node is provided to the gate electrode of the second current steering PMOS transistor, and voltage at the fourth circuit node is provided to the gate electrode of the first current steering PMOS transistor;

a first protection PMOS transistor including a first current electrode coupled to the second current electrode of the first current steering PMOS transistor, a second current electrode coupled to a fifth node, and a gate electrode coupled to a first bias voltage;

a first protection NMOS transistor including a first current electrode coupled to the fifth node, a second current electrode coupled to a seventh node, and a gate electrode coupled to a second bias voltage;

a second protection PMOS transistor including a first current electrode coupled to the second current electrode of the second current steering PMOS transistor, a second current electrode coupled to a sixth node, and a gate electrode coupled to the gate electrode of first protection PMOS transistor; and a second protection NMOS transistor including a first current electrode coupled to the sixth node, a second current electrode coupled to an eighth node, and a gate electrode coupled to the gate electrode of the first protection NMOS transistor.

21. The integrated circuit device of claim 20 further comprising:
a third NMOS transistor including a first current electrode coupled to the second current electrode of the second current steering NMOS transistor, a second current electrode coupled to a supply voltage, and a gate electrode;
a first resistive element including a first terminal coupled to the fifth node and a second terminal coupled to a ninth node;
a second resistive element including a first terminal coupled to the ninth node and a second terminal coupled to the sixth node;
an amplifier including a first input coupled to the ninth node, a second input coupled to a target common mode voltage, and an output coupled to the gate electrode of the third NMOS transistor.

22. The integrated circuit device of claim 20 further comprising:
a first diode-connected NMOS transistor coupled between the second and seventh nodes;
a first diode-connected PMOS transistor coupled in parallel with the first diode-connected NMOS transistor;
a third resistive element coupled in parallel with the first diode-connected NMOS transistor and the first diode-connected PMOS transistor;
a second diode-connected NMOS transistor coupled between the fourth and eighth nodes;
a second diode-connected PMOS transistor coupled in parallel with the second diode-connected NMOS transistor; and
a fourth resistive element coupled in parallel with the second diode-connected NMOS transistor and the second diode-connected PMOS transistor.

* * * * *